United States Patent [19]
Balamurugan

[11] Patent Number: 5,933,351
[45] Date of Patent: Aug. 3, 1999

[54] SYSTEM AND METHOD FOR LOCATING DIES CUT FROM A SILICON WAFER ON A WAFER TABLE

[75] Inventor: Subramanian Balamurugan, Singapore, Singapore

[73] Assignee: Texas Instruments Incorporated, Dallas, Tex.

[21] Appl. No.: 08/967,831

[22] Filed: Nov. 12, 1997

[51] Int. Cl.$^6$ .......................... G06F 19/00; G01B 11/14
[52] U.S. Cl. ............................. 364/468.28; 364/468.15; 364/490; 364/468.01; 364/468.21; 438/460; 438/462; 148/DIG. 28; 356/375; 356/376
[58] Field of Search .................... 364/468.15, 468.28, 364/490, 194, 468.01, 468.17, 468.78, 468.21; 437/226; 414/780, 781; 438/110, 113, 464, 460, 462, 800

[56] References Cited

U.S. PATENT DOCUMENTS

| | | | |
|---|---|---|---|
| 4,914,601 | 4/1990 | Smyth, Jr. | 364/490 |
| 5,362,681 | 11/1994 | Roberts, Jr. et al. | 437/226 |
| 5,706,201 | 1/1998 | Andrews | 364/468.15 |

*Primary Examiner*—William Grant
*Assistant Examiner*—Peter W. Eissmann
*Attorney, Agent, or Firm*—Wade James Brady, III; Richard L. Donaldson

[57] ABSTRACT

A method for locating dies (70) cut from a silicon wafer (54) on a wafer table (14) is provided. The method includes removing a first group of dies (70) with a robot assembly (16). Wafer location data (62) is then generated from the location (66, 68) of the first group of dies (70). Continuous wafer edge coordinates are then determined from the wafer location data (62).

19 Claims, 3 Drawing Sheets

SYSTEM AND METHOD FOR LOCATING DIES CUT FROM A SILICON WAFER ON A WAFER TABLE

TECHNICAL FIELD OF THE INVENTION

This invention relates to semiconductor circuit manufacturing and more particularly to a system and method for locating dies cut from a silicon wafer on a wafer table.

BACKGROUND OF THE INVENTION

Semiconductor manufacturing includes the process of moving semiconductor substrate dies from a wafer table to a lead frame after they have been cut from a silicon wafer of substrate material. A silicon wafer first is placed on an adhesive surface and is cut into rectangular dies. After cutting, the adhesive surface is placed on a wafer table of a die bonder apparatus. The die bonder deposits an adhesive on the lead frame, removes a cut die from the adhesive surface, and places it on the lead frame on the deposited adhesive. The silicon wafer from which the dies are cut is round, such that some dies are not fully rectangular. These nonrectangular dies will be left on the adhesive surface and discarded.

If the process of removing dies from a silicon wafer is automated, the position of the silicon wafer and dies must be known or estimated, to allow a robot arm to manipulate the wafer and dies. Nevertheless, the position of the silicon wafer with respect to the known coordinates of the adhesive surface may randomly change during the die cutting operation. When such random changes occur, no die may be present at some locations in which a die is expected. This condition may result in unnecessary wafer table movements to locate the cut dies.

To prevent this condition from occurring, known methods of automating the removal of cut dies from a silicon wafer typically include conservative assumptions about the location of the wafer on the wafer table. These assumptions may result in a loss of usable cut dies, or the performance of additional robot arm movements that increase the time needed to remove the cut dies.

SUMMARY OF THE INVENTION

Therefore, it is a general object of the present invention to provide a system and method for locating dies cut from a silicon wafer on a wafer table that substantially eliminates or reduces the problems associated with locating dies.

In particular, a system and method for locating dies cut from a silicon wafer on a wafer table is required that may be used to prevent operational errors during the die removal process and to reduce or prevent waste of usable cut dies.

According to one embodiment of the present invention, a method for locating dies cut from a silicon wafer on a wafer table is provided. The method includes removing dies with a robot assembly. Wafer location data is then generated from the location of the dies. The continuous wafer edge coordinates are then determined from the wafer location data.

One important technical advantage of the present invention is that the center of a silicon wafer on a wafer table may be precisely located. The position of dies on the wafer table can then also be precisely located with respect to the center of the silicon wafer.

Another important technical advantage of the present invention is that die removal methods may be implemented that reduce the number of usable cut dies that may be lost during the die removal process.

BRIEF DESCRIPTION OF THE DRAWINGS

For a more complete understanding of the present invention and advantages thereof, reference is now made to the following description taken in conjunction with the accompanying drawings, in which like reference numbers indicate like features and wherein.

DETAILED DESCRIPTION OF THE INVENTION

Preferred embodiments of the present invention are illustrated in the FIGURES, like numerals being used to refer to like and corresponding parts of the various drawings.

Figure 1:
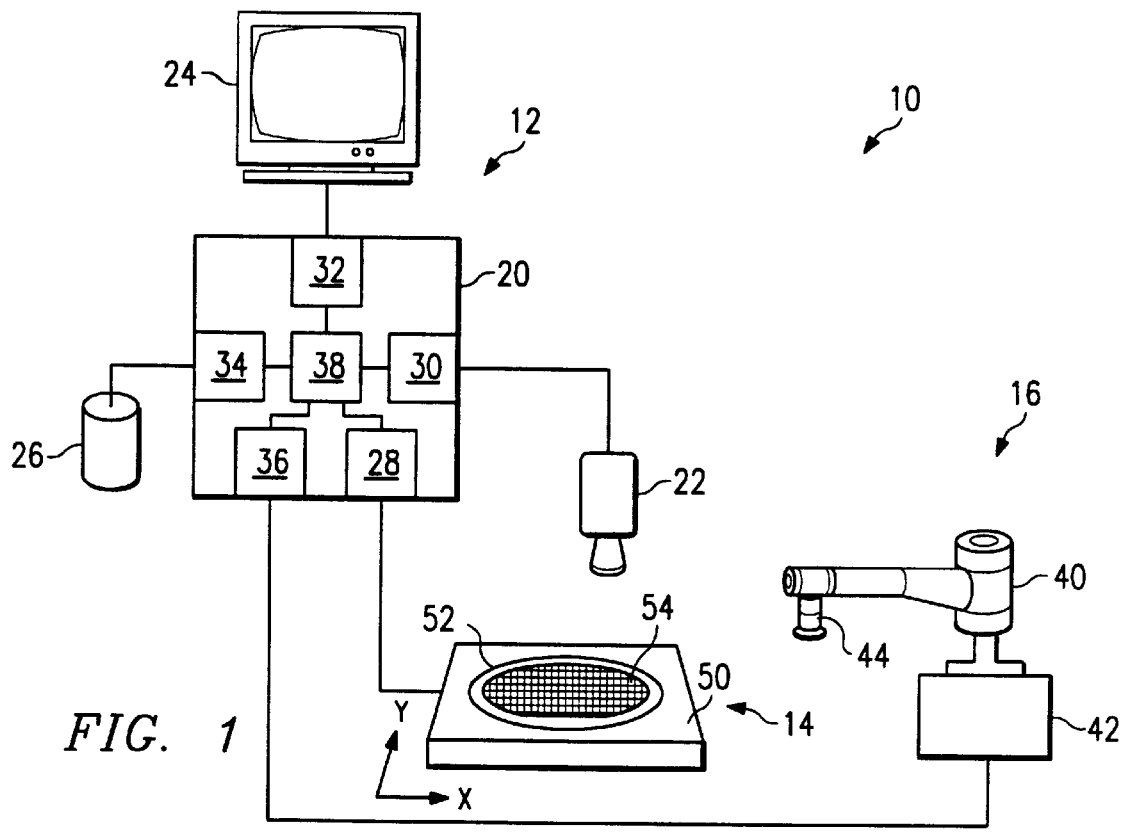
FIG. 1 is a diagram of a system for finding the center of a silicon wafer on a wafer table according to one embodiment of the present invention.

FIG. 1 is a diagram of a system 10 for finding the center of a silicon wafer on a wafer table according to one embodiment of the present invention. System 10 may be an Abacus IIID-SETTLEMENT AGREEMENT Die Bonder of Texas Instruments Incorporated. System 10 includes a data processing system 12, a wafer table system 14, and a robot assembly 16. Data processing system 12 is coupled to wafer table system 14 and robot assembly 16, and controls wafer table system 14 and robot assembly 16 to remove dies cut from a silicon wafer 54 on wafer table 50.

Data processing system 12 includes a central processing system 20, which is coupled to a video camera 22, a display 24, a data storage system 26, robot assembly 16 and wafer table 50. To interface with the peripheral components described, central processing system 20 uses, respectively, a video interface system 30, a display interface system 32, a data storage interface system 34, a robot assembly interface system 36, and a wafer table interface system 28. Central processing system 20 also comprises wafer center computing system 38.

Wafer center computing system 38 comprises suitable hardware, operating system software, and software applications that operate on central processing system 20. Wafer center computing system 38 is coupled to wafer table interface system 28, video interface system 30, display interface system 32, data storage interface system 34, and robot assembly interface system 36. Wafer center computing system 38 receives analog or digital data from video camera 22 through video interface system 30. Wafer center computing system 38 processes the analog or digital data and transmits data comprising the coordinates of the center of silicon wafer 54 to wafer table 50 of wafer table system 14.

Video camera 22 comprises a charge coupled device (CCD) such as a solid state camera, which converts a visual image into analog or digital data. Video camera 22 may alternately comprise many suitable silicon wafer data sensors that can generate data that defines the location of cut dies from silicon wafer 54 on wafer table 50. Video camera 22 is focused on wafer table 50 and generates analog or digital data that may be used by display interface system 32 to generate an image of cut dies from silicon wafer 54 on a wafer table 50. Video camera 22 is coupled to video interface system 30.

Display 24 is a visual interface used to present visual images for viewing by a user. Display 24 may comprise a monitor using a cathode ray tube, a liquid crystal diode, or other suitable visual interface devices. Display 24 is coupled to display interface system 32 operating on central processing system 20, which supplies image data to display 24 from other systems. Display 24 can present textual and graphical images to a user, such as a warning message or an image generated from data received from video camera 22.

Data storage system 26 comprises a data memory device, such as a random access memory (RAM), a magnetic media hard drive, a magnetic tape drive, or other suitable data memory devices. Data storage system 26 is coupled to data storage interface system 34 and can store and retrieve digitally-encoded data in response to operating system commands.

Wafer table interface system 28 comprises suitable hardware, operating system software, and software applications that operate on central processing system 20. Wafer table interface system 28 is coupled to wafer center computing system 38 and wafer table 50. Wafer table interface system 28 transmits data to wafer table 50 that defines the location of the center of silicon wafer 54 in a Cartesian coordinate system of wafer table 50.

Video interface system 30 comprises suitable hardware, operating system software, and software applications that operate on central processing system 20. Video interface system 30 is coupled to wafer center computing system 38 and video camera 22. Video interface system 30 receives data from video camera 22 and transmits the data to wafer center computing system 38. Video interface system 30 may include image recognition programs that process the data from video camera 22 and identify dies cut from silicon wafer 54, predetermined edge points of silicon wafer 54, or other suitable images.

Display interface system 32 comprises suitable hardware, operating system software, and software applications that operate on central processing system 20. Display interface system 32 is coupled to wafer center computing system 38 and display 24. Display interface system 32 receives data from wafer center computing system 38 and other systems and transmits the data to display 24.

Data storage interface system 34 comprises suitable hardware, operating system software, and software applications that operate on central processing system 20. Data storage interface system 34 is coupled to data storage system 26 and wafer center computing system 38. Data storage interface system 34 transfers data between wafer center computing system 38 and other systems and components, and stores the data on data storage system 26.

Robot assembly 16 includes robot arm 40 and robot controller 42. Robot assembly 16 may be, for example, a robot assembly of an Abacus IIID-SETTLEMENT AGREEMENT Die Bonder of Texas Instruments Incorporated. Robot arm 40 is a controllable electromechanical device that may be moved in three dimensions, and which has a controllable suction device 44. Robot controller 42 is coupled to robot arm 40 and robot assembly interface system 36.

Robot controller 42 is a programmable controller that controls the movement of robot arm 40 such that suction device 44 may be placed at a die removal position. Robot controller 42 may cause the die to be held by suction device 44 while robot arm 40 moves the die to an appropriate location, such as a lead frame (not explicitly shown). Robot controller 42 typically causes suction device 44 to be placed at the same location relative to wafer table 50, such that the placement of dies for removal by suction device 44 is accomplished by moving wafer table 50 in the "X" and "Y" directions shown in FIG. 1.

Wafer table system 14 may be a wafer table system of an Abacus IIID-SETTLEMENT AGREEMENT Die Bonder of Texas Instruments Incorporated. Wafer table system 14 includes wafer table 50, adhesive surface 52, and silicon wafer 54. Wafer table 50 comprises a programmable controller and suitable motive elements, and is operable to move in an "X" direction and a "Y" direction, as shown in FIG. 1, in response to control signals received from wafer table interface system 28. Adhesive surface 52 comprises an adhesive material that is used to hold silicon wafer 54. As previously noted, silicon wafer 54 moves relative to adhesive surface 52 during cutting operations.

In operation, data transmitted to wafer center computing system 38 from video camera 22 is used to calculate the center coordinates of silicon wafer 54 in a Cartesian coordinate system of wafer table 50. Wafer center computing system 38 then transmits the center coordinates of silicon wafer 54 to wafer table 50. Robot controller 42 moves suction device 44 of robot arm 40 to a predetermined location where dies cut from silicon wafer 54 may be removed. Wafer table 50 uses the wafer center coordinates of silicon wafer 54 to precisely control the position of the cut dies relative to suction device 44 of robot arm 40.

Figure 2:
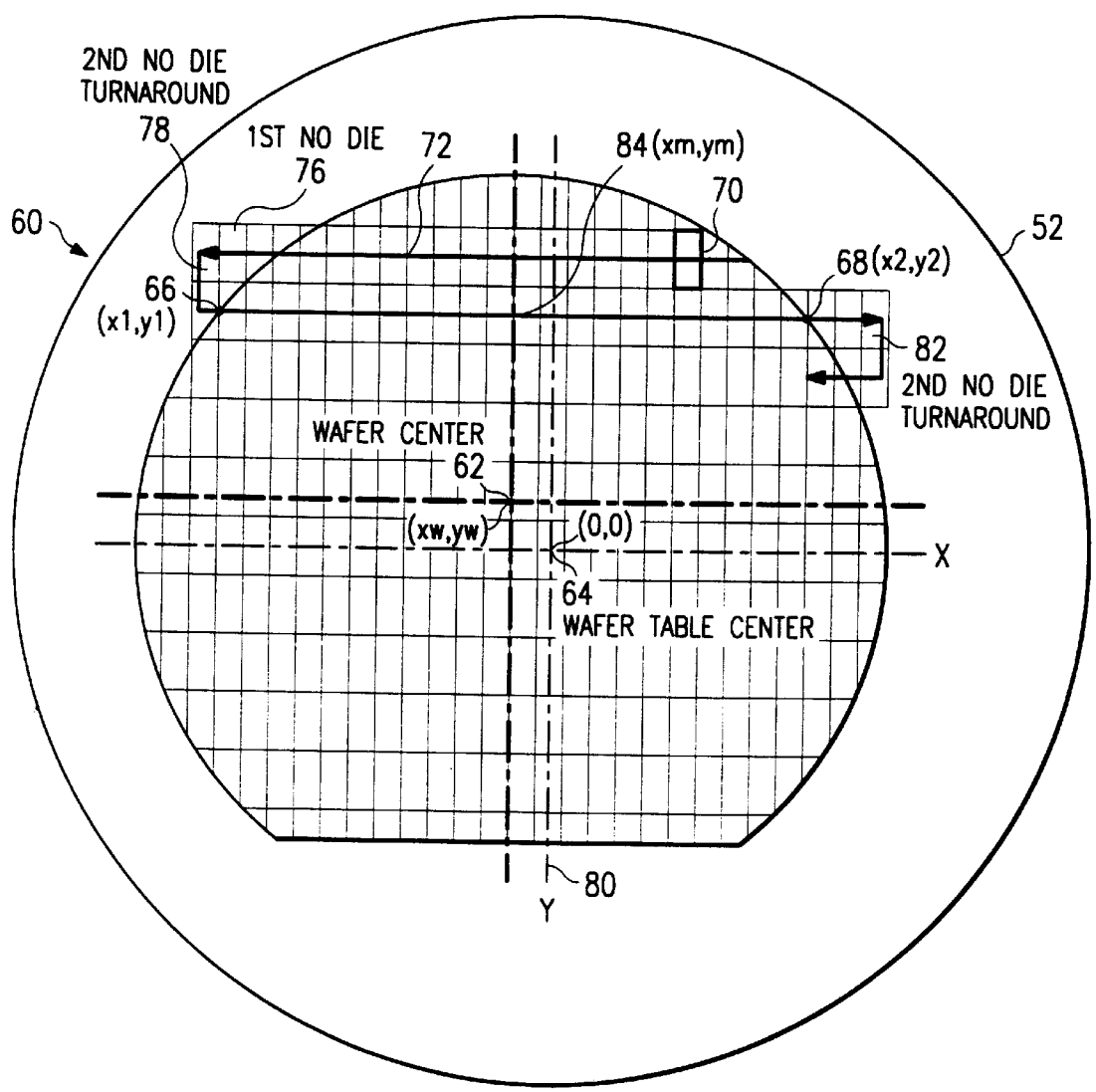
FIG. 2 is a diagram showing the sequence in which cut dies are removed from the wafer table in accordance with the teachings of the present invention.

FIG. 2 is an exemplary diagram 60 showing the sequence in which cut dies are removed from wafer table 50 of FIG. 1 in accordance with the teachings of the present invention. Diagram 60 shows an exemplary location of wafer center 62 (Xw,Yw), which is at a different position than wafer table center 64 (0,0). Data transmitted from video camera 22 to wafer center computing system 38 of FIG. 1 that defines a first edge point 66 (X1,Y1) and a second edge point 68 (X2,Y2) is used to compute wafer center 62.

Die removal begins with an index start die 70, and proceeds in the direction shown by arrow 72. Suction device 44 of robot arm 40 of FIG. 1 is used to remove dies from wafer table 50. The dies are moved to a lead frame (not explicitly shown) or other suitable location by robot arm 40 after removal. Wafer center computing system 38 is operable to detect when no die has been picked up by suction device 44 of robot arm 40, which occurs at the position of first no die 76. For example, video interface system 30 may include image recognition programs that are operable to determine when the present die to be removed is not rectangular, is absent, or is otherwise defective. An appropriate signal may then be transmitted to robot controller 42 to prevent attempted retrieval of the defective die with suction device 44. Wafer table 50 then moves silicon wafer 54 to the next die position, which is second no die turnaround 78.

After wafer center computing system 38 receives a second no die signal, wafer table 50 moves silicon wafer 54 to the position of the die having first edge point 66 at the right center edge of the die. This die is the die indexed at the position adjacent to second no die turnaround 78, in the direction of the X-axis of a Cartesian coordinate system 80. The coordinates of first edge point 66 in Cartesian coordinate system 80 are then determined by wafer center computing system 38.

Die removal proceeds in the direction shown by arrow 72 in a manner similar to that described above, until second no die turnaround 82 is reached. Wafer center computing system 38 then determines the coordinates of second edge point 68 in Cartesian coordinate system 80 from the coordinates of second no die turnaround 82. For example, wafer center computing system 38 may compute the left center edge coordinates of the die located two positions away from second no die turnaround 82 in the direction of the negative Y-axis.

After removal of this first group of dies is completed, wafer center computing system 38 uses the coordinates of first edge point 66 and second edge point 68 to compute the coordinates of a wafer center 62 (Xw,Yw) in Cartesian coordinate system 80 of wafer table 50. For example, the coordinates of wafer center 62 may be computed from the coordinates of first edge point 66, the coordinates of second edge point 68, and the coordinates of wafer table center 64 by the following equations:

$R$=radius of silicon wafer 54

$Xm=(X1+X2)/2$ $Ym=(Y1+Y2)/2$ $D=\text{SQRT}\ ((X1-Xm)*(X1-Xm))+((Y1-Ym)*(Y1-Ym))$ $C=\text{SQRT}\ ((R*R)-(D*D))$ $Xw=Xm$ $Yw=Ym+C$ if $Ym$ is negative $=Ym-C$ if $Ym$ is positive Thus, using the equations shown above, it is possible to compute the coordinates of wafer center 62 in Cartesian coordinate system 80 from the coordinates of first edge point 66 and the coordinates of second edge point 68. Die removal then proceeds in the manner shown in FIG. 3.

One of ordinary skill in the art will recognize that various changes, substitutions, and alterations can be made to diagram 60 and the method used to determine wafer center 62 without departing from the teachings of the present invention. For example, other predetermined points besides first edge point 66 and second edge point 68 may be used to compute the coordinates of wafer center 62. Furthermore, other mathematical operations may be used to compute the coordinates of wafer center 62 than those described above.

Figure 3A:
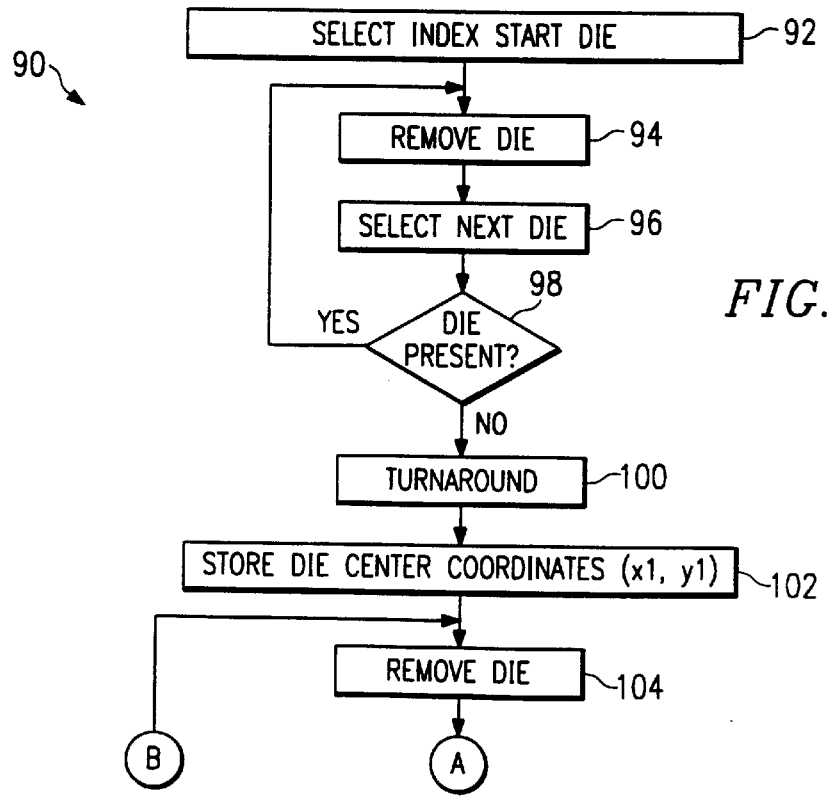
FIGS. 3A and 3B are a flow chart of a method for locating the wafer center of a silicon wafer and for removing dies cut from the silicon wafer.
Figure 3B:
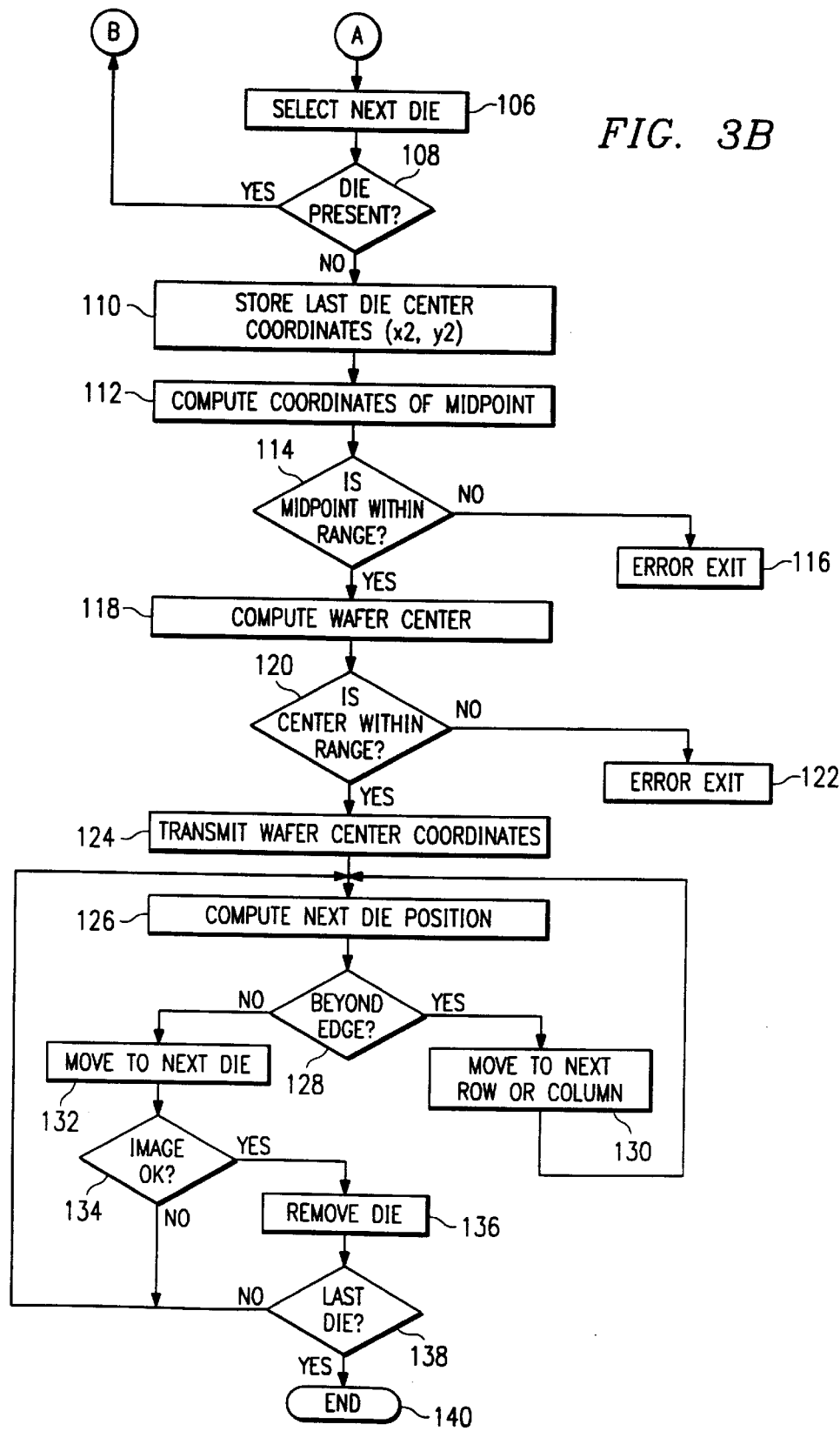

FIGS. 3A and 3B are an exemplary flow chart 90 of a method for determining the coordinates of wafer center 62, such as would be implemented by wafer center computing system 38 of FIG. 1, and for controlling wafer table 50. The method of flow chart 90 begins at step 92, where index start die 70 of FIG. 2 is selected and retrieved by suction device 44 of robot arm 40. Index start die 70 may be selected from a predetermined assumed position of silicon wafer 54. Alternately, wafer table 50 may be moved to an initial position based upon sensor data generated by video camera 22 of FIG. 1.

After index start die 70 has been selected and retrieved by suction device 44, the method of flow chart 90 proceeds to step 94, where the selected die is removed to a lead frame (not explicitly shown) or other suitable location. The method then proceeds to step 96, where wafer table 50 moves silicon wafer 54 to the position where the next die is expected to be. This position may be determined based upon wafer and die dimension data stored on data storage system 26 or other suitable data storage devices.

At step 98, the presence of a die is tested for by video interface system 30. For example, image recognition programs of video interface system 30 may generate an enable signal if the image data generated by video camera 22 indicates that a usable die is present at the retrieval location. If a die is present, the method returns to step 94. Otherwise, wafer table 50 moves silicon wafer 54 to the next expected die location. If a die is present at the next expected die location, then the method returns to step 94. Otherwise, the method proceeds to step 100.

At step 100, a turnaround is performed by wafer table 50 by moving silicon wafer 54 to the next adjacent die location in the direction of the X-axis. At step 102, the coordinates of the right center edge of the presently selected die in Cartesian coordinate system 80 of FIG. 2 are stored on data storage system 26 or other suitable data memory device as first edge point 66 of FIG. 2. Wafer table 50 then advances silicon wafer 54 to the second die in the positive X-axis direction, i.e., in the direction of arrow 72 of FIG. 2, and robot controller 42 causes suction device 44 to retrieve the die at that location. The method then proceeds to step 104.

At step 104, the selected die is removed to a lead frame (not explicitly shown) or other suitable location. The method then proceeds to step 106, where wafer table 50 moves silicon wafer 54 to the position where the next die is expected to be. This position may be determined based upon wafer and die dimension data stored on data storage system 26 or other suitable data storage devices. The method then proceeds to step 108.

At step 108, the presence of a die is tested for by the image recognition programs of video interface system 30. If a die is present, the method returns to step 104. Otherwise, wafer table 50 moves silicon wafer 54 to the next expected die location. If a die is present at the next expected die location, then the method returns to step 104. Otherwise, the method proceeds to step 110.

At step 110, the coordinates of the left center edge of the last present die are stored on data storage system 26 or other suitable memory devices as second edge point 68 of FIG. 2. The stored first edge point 66 and second edge point 68 are then retrieved and transmitted to wafer center computing system 38. The method then proceeds to step 112.

At step 112, the coordinates of midpoint 84 (Xm,Ym) of FIG. 2 are computed. For example, midpoint 84 may be determined by averaging the "X" coordinate values of first edge point 66 and second edge point 68, and averaging the "Y" coordinate values of first edge point 66 and second edge point 68. The method then proceeds to step 114.

At step 114, it is determined whether an allowable midpoint 84 has been computed. For example, if the coordinates computed for midpoint 84 exceed the range of allowable midpoints for a silicon wafer 54 placed on wafer table 50, then the method proceeds to step 116, and exits on an error signal. Otherwise, the method proceeds to step 118.

At step 118, wafer center 62 is computed. For example, wafer center 62 may be computed using the mathematical algorithms previously provided in the description of FIG. 3. The method then proceeds to step 120, where it is determined whether an allowable wafer center 62 has been computed. For example, if the coordinates computed for wafer center 62 exceed the range of allowable coordinates of wafer center 62 for a silicon wafer 54 placed on wafer table 50, the method proceeds to step 122 and exits on an error message. Otherwise, the method proceeds to step 124.

At step 124, the coordinates of wafer center 62 are transmitted from wafer center computing system 38 to robot controller 42 of FIG. 1. At step 126, wafer table 50 computes the coordinates of the next die to be removed. These coordinates may be determined by adding or subtracting the "X" dimension of one die from the X-axis coordinates of the previously-removed die, depending upon the direction in which die removal is progressing. At step 128, wafer table 50 checks the coordinates of the next die to determine if the coordinates are beyond the calculated wafer edge of silicon wafer 54. If the coordinates are beyond the wafer edge, the method proceeds to step 130, and wafer table 50 moves silicon wafer 54 to the next row or column. Otherwise, the method proceeds to step 132.

At step 132, wafer table 50 moves silicon wafer 54 to the position of the next die to be removed. The image of this die is checked at step 134 to verify that an acceptable die is present. As previously described, image recognition software of video interface system 30 may be used to determine whether an acceptable die is present. If the image indicates that an acceptable die is present, the method proceeds to step 136, where die removal is performed. Otherwise, the method returns to step 126.

After die removal has been completed at step 136, the method proceeds to step 138 where it is determined whether the last die has been removed. If the last die has been removed, the method terminates at step 140. Otherwise, the method returns to step 126.

In operation, dies are cut from silicon wafer 54 after it is placed on adhesive surface 52. Silicon wafer 54 moves with respect to the Cartesian coordinate system 80 of wafer table 50 during the die cutting process. This movement makes it necessary to determine the new location of silicon wafer 54 before the cut dies may be automatically removed in accordance with the present invention. Wafer center computing system 38 receives data from video camera 22 and video interface system 30 and determines the coordinates of wafer center 62 of silicon wafer 54 within Cartesian coordinate system 80 of wafer table 50.

The coordinates of wafer center 62 are then transmitted to wafer table 50, which uses the coordinates of wafer center 62 to compute the coordinates of the edge of silicon wafer 54. Wafer table 50 then controls the location of silicon wafer 54 such that robot arm 40 and suction device 44 may be used to remove the cut dies from wafer table 50.

The present invention provides many important technical advantages. One important technical advantage of the present invention is that the center of a silicon wafer on a wafer table may be precisely located. Another important technical advantage of the present invention is that die removal methods may be implemented that reduce the number of usable cut dies that may be lost during the die removal process.

Although the present invention has been described in detail, it should be understood that various changes, substitutions, and alterations can be made hereto without departing from the spirit and the scope of the invention as defined by the appended claims.

What is claimed is:

1. A method for accurately determining the location on a wafer table of dies cut from a semiconductor wafer disposed on said wafer table, comprising the steps of:
   providing the coordinates of a known location on said wafer table;
   determining the coordinates of the center of said semiconductor wafer; and
   locating the coordinates of said dies on said wafer table by calculating the offset between said known location on said wafer table and said center of said semiconductor wafer.

2. The method of claim 1 wherein said known location of said wafer table is the center of said wafer table.

3. The method of claim 2 wherein said step of determining the coordinates of said center of said semiconductor wafer comprises the steps of removing a first group of dies along a first coordinate extending to a die at a first edge region of said semiconductor wafer with a robot assembly;
   generating wafer location data of said die at said first edge region; and
   determining coordinates of the wafer from the wafer location data.

4. The method of claim 3 wherein the step of determining the coordinates of the center of said semiconductor wafer comprises the steps of:
   performing a first turnaround at a first edge region of said wafer while removing a first group of dies in a first direction;
   determining the coordinates of said first edge region of said wafer having coordinates (X1, Y1);
   performing a second turnaround at a second edge region of said wafer while removing a second group of dies in a direction different from said first direction; and
   determining the coordinates of said second edge region of said wafer having coordinates (X2, Y2).

5. The method of claim 4 further comprising the step of computing an X-axis coordinate (Xw) and a Y-axis coordinate (Yw) of wafer center coordinates from the first edge region and the second edge region.

6. The method of claim 5 wherein the step of computing comprises the steps of:
   computing a value of the X-axis coordinate (Xm) of a midpoint of a line bisecting the wafer equal to (X1+X2)/2;
   computing a value of the Y-axis coordinate (Ym) of the midpoint of the line bisecting the wafer equal to (Y1+Y2)/2;
   computing a first distance (D) between the midpoint of the line bisecting the wafer having coordinates (Xm,Ym) and one of the first edge region point and the second edge region;
   computing a second distance (C) between the midpoint and a wafer table center; and
   computing the wafer center coordinates (Xw,Yw) from the midpoint coordinates (Xm,Ym) and C.

7. The method of claim 6 wherein the step of computing the first distance comprises the step of finding the square root of ((X1−Xm)*(X1−Xm)+(Y1−Ym)*(Y1−Ym)).

8. The method of claim 6 wherein the step of computing the second distance comprises the step of finding the square root of((R*R)−(D*D)), where R equals a radius of the wafer.

9. The method of claim 6 wherein the step of computing the coordinates of the wafer center comprises the steps of:
   equating the wafer center X-axis coordinate (Xw) to Xm;
   equating the wafer center Y-axis coordinate (Yw) to (Ym+C) if Ym is negative; and
   equating Yw to (Ym−C) if Ym is positive.

10. The method of claim 1 wherein the step of removing each of the dies with a robot assembly further comprises the steps of:
    moving each of the plurality of dies to a die removal position;
    moving the wafer to a predetermined location if the die removal position is beyond the continuous wafer edge coordinates; and
    removing each of the dies with the robot assembly.

11. A method for removing from a wafer table a plurality of dies cut from a semiconductor wafer, the method comprising the steps of:
    providing a wafer table having a wafer cut into dies disposed thereon;
    providing a robot assembly for removing dies from said wafer table;

removing a first group of dies with said robot assembly;

performing a first turnaround while removing the first group of dies;

determining a first edge point of the wafer having coordinates (X1,Y1);

performing a second turnaround while removing a second group of dies;

determining a second edge point of the wafer having coordinates (X2,Y2);

computing a value of an X-axis coordinate (Xm) of a midpoint of a line bisecting the wafer equal to (X1+Y1)/2;

computing a value of a Y-axis coordinate (Ym) of the midpoint of the line bisecting the wafer equal to (Y1+Y2)/2;

computing a first distance (D) between (Xm,Ym) and one of the first edge point and the second edge point;

computing a second distance (C) between the midpoint and a wafer table center;

computing coordinates of a wafer center (Xw,Yw);

determining continuous wafer edge coordinates of the wafer from the wafer location data;

moving each of the plurality of dies to a die removal position;

moving the wafer to a predetermined location if the die removal position is beyond the continuous wafer edge coordinates; and removing each of the dies with the robot assembly.

12. The method of claim 11 wherein the step of computing the first distance comprises the step of finding the square root of ((X1−Xm)*(X1−Xm)+(Y1−Ym)*(Y1−Ym)).

13. The method of claim 11 wherein the step of computing the second distance comprises the step of finding the square root of((R*R)−(D*D)), where R equals a radius of the wafer.

14. The method of claim 11 wherein the step of computing the coordinates of the wafer center comprises the steps of:

equating the wafer center X-axis coordinate (Xw) to Xm;

equating the wafer center Y-axis coordinate (Yw) to (Ym+C) if Ym is negative; and equating Yw to (Ym−C) if Ym is positive.

15. A system for removing a plurality of dies cut from a semiconductor wafer, comprising:

a robot arm operable to remove dies from a die removal position of a wafer table;

said wafer table supporting the wafer and operable to control the location of the wafer to place each of the dies at said die removal position, the wafer table further operable to perform a first turnaround and a second turnaround;

a wafer center computing system coupled to the wafer table, the wafer center computing system operable to determine a first edge point coordinate from the first turnaround and a second edge point from the second turnaround; and circuitry responsive to the offset of the computed wafer center from the center of said wafer table for adjusting the position of a said die relative to said robot arm.

16. The system of claim 15 further comprising:

a suction device coupled to the robot arm; and a robot controller coupled to the robot arm and the wafer table, the robot controller operable to move the robot arm such that the suction device is placed at the die removal position.

17. The system of claim 15 further comprising:

a wafer data sensor coupled to the wafer center computing system and the wafer table, the wafer data sensor operable to generate wafer data and to transmit the wafer data to the wafer center computing system and the wafer table; and the wafer table operable to perform the first and second turnaround after receiving first and second predetermined data, respectively, from the wafer data sensor.

18. The system of claim 17 further comprising a robot arm coupled to the wafer table, the robot arm operable to remove dies from the die removal position of the wafer table.

19. The system of claim 18 further comprising:

a suction device coupled to the robot arm; and a robot controller coupled to the robot arm and the wafer table, the robot controller operable to move the robot arm such that the suction device is placed at the die removal position.

* * * * *